US009620583B2

(12) United States Patent
Kelkar et al.

(10) Patent No.: US 9,620,583 B2
(45) Date of Patent: Apr. 11, 2017

(54) POWER SEMICONDUCTOR DEVICE WITH SOURCE TRENCH AND TERMINATION TRENCH IMPLANTS

(71) Applicant: Infineon Technologies Americas Corp., El Segundo, CA (US)

(72) Inventors: Kapil Kelkar, Torrance, CA (US); Timothy D. Henson, Mount Shasta, CA (US); Ling Ma, Redondo Beach, CA (US); Mary Bigglestone, Newport (GB); Adam Amali, Chandler, AZ (US); Hugo Burke, Llantrisant (GB); Robert Haase, San Pedro, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/856,241

(22) Filed: Sep. 16, 2015

(65) Prior Publication Data

US 2016/0104766 A1    Apr. 14, 2016

Related U.S. Application Data

(60) Provisional application No. 62/061,333, filed on Oct. 8, 2014.

(51) Int. Cl.
| | | |
|---|---|---|
| *H01L 29/66* | (2006.01) | |
| *H01L 29/06* | (2006.01) | |
| *H01L 29/78* | (2006.01) | |
| *H01L 29/40* | (2006.01) | |
| *H01L 29/739* | (2006.01) | |

(52) U.S. Cl.
CPC ........ *H01L 29/0623* (2013.01); *H01L 29/404* (2013.01); *H01L 29/407* (2013.01); *H01L 29/66734* (2013.01); *H01L 29/7397* (2013.01); *H01L 29/7811* (2013.01); *H01L 29/7813* (2013.01)

(58) Field of Classification Search
CPC ............ H01L 29/0865; H01L 29/7811; H01L 29/7813
See application file for complete search history.

(56) References Cited

U.S. PATENT DOCUMENTS

| | | | | |
|---|---|---|---|---|
| 2007/0004116 A1* | 1/2007 | Hshieh | ................... | H01L 24/26 438/197 |
| 2009/0140327 A1* | 6/2009 | Hirao | ................... | H01L 29/407 257/328 |
| 2014/0374824 A1* | 12/2014 | Calafut | ............... | H01L 27/0629 257/334 |

* cited by examiner

*Primary Examiner* — Marc Armand
*Assistant Examiner* — Sarah Salerno
(74) *Attorney, Agent, or Firm* — Murphy, Bilak & Homiller, PLLC

(57) ABSTRACT

A power semiconductor device is disclosed. The power semiconductor device includes a source region in a body region, a gate trench adjacent to the source region, and a source trench electrically coupled to the source region. The source trench includes a source trench conductive filler surrounded by a source trench dielectric liner, and extends into a drift region. The power semiconductor device includes a source trench implant below the source trench and a drain region below the drift region, where the source trench implant has a conductivity type opposite that of the drift region. The power semiconductor device may also include a termination trench adjacent to the source trench, where the termination trench includes a termination trench conductive filler surrounded by a termination trench dielectric liner. The power semiconductor device may also include a termination trench implant below the termination trench.

20 Claims, 8 Drawing Sheets

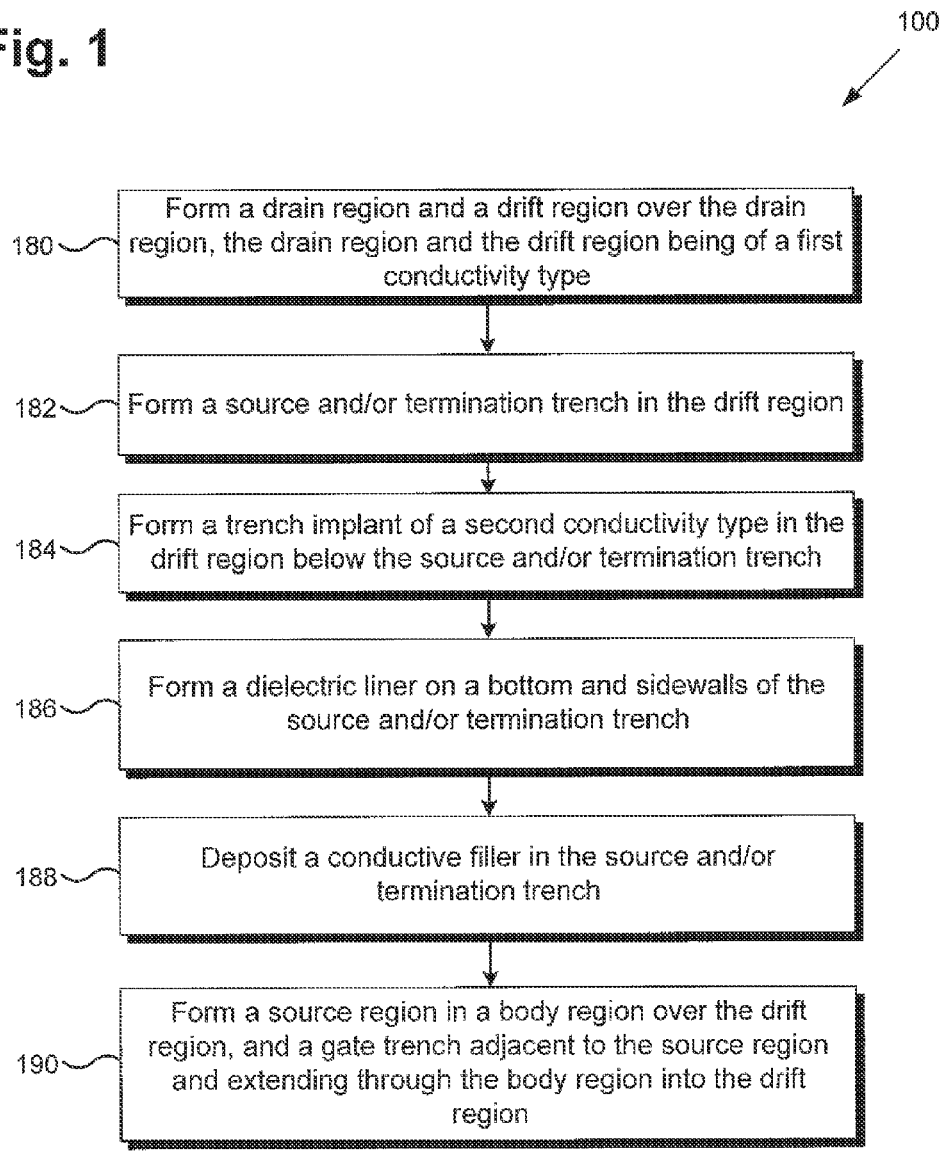

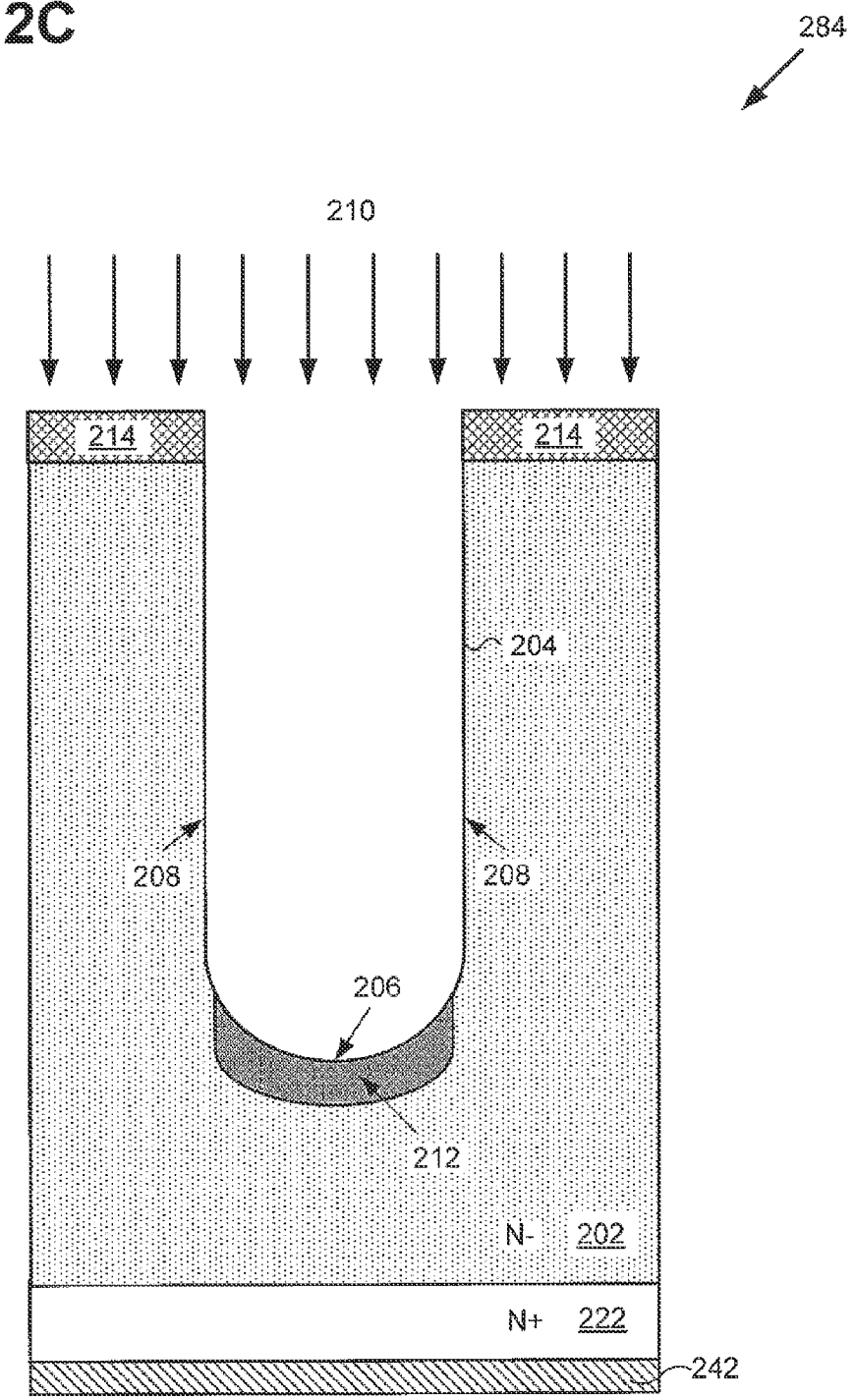

POWER SEMICONDUCTOR DEVICE WITH SOURCE TRENCH AND TERMINATION TRENCH IMPLANTS

The present application claims the benefit of and priority to a provisional patent application entitled "P Type Implant in a Source Trench of an Oxide Charge Balance Device," Ser. No. 62/061,333 filed on Oct. 8, 2014. The disclosure in this provisional application is hereby incorporated fully by reference into the present application.

BACKGROUND

In trench type power semiconductor devices, such as trench power metal oxide semiconductor field effect transistors (MOSFETs) and insulated-gate bipolar transistors (IGBTs), on-state resistance ($R_{DSon}$), breakdown voltage (BV) and output capacitance (Coss) are among some of the defining performance parameters. The on-state resistance is the drain-to-source resistance of the trench type power semiconductor device in an on-state, which depends partially on the depth of a source trench. The breakdown voltage is the voltage at which a reverse biased body-drift p-n junction breaks down and significant current starts to flow between a source and a drain of the trench type power semiconductor device by an avalanche multiplication process. The output capacitance can be dominated mated by a drain-to-source capacitance ($C_{DS}$) and a gate-to-drain capacitance ($C_{GD}$). The drain-to-source capacitance includes a capacitance associated with a source-to-drain overlap, which is an overlap of the conductive filler in the source trench and the semiconductor material between the source trench and the drain region. Having a high output capacitance can cause high ringing of a switch node and increase switching loss, thereby decreasing circuit efficiency.

It is desirable for a trench type power semiconductor device to have reduced $R_{DSon}$ and Coss, and still be able to withstand a high drain-to-source voltage during its off-state a high reverse voltage blocking capability). However, there are trade-offs among these parameters in the design of a trench type power semiconductor device. For example, in a conventional trench type power semiconductor device, while the on-state resistance and breakdown voltage are both related to the depth of the source trench, it is very difficult to improve both the on-state resistance and breakdown voltage by adjusting the depth of the source trench. In addition, in the conventional trench type power semiconductor device, impact ionization mainly occurs along the bottom and sidewalls of the source trench causing damage at the semiconductor-dielectric interface, which may lead to an increase in drain-to-source leakage and/or breakdown voltage degradation.

Accordingly, there is a need to overcome the drawbacks and deficiencies in the art by providing a power semiconductor device, such as a power MOSFET, with reduced on-state resistance and output capacitance without compromising the reverse voltage blocking capability (i.e. the breakdown voltage) of the power semiconductor device.

SUMMARY

The present disclosure is directed to a power semiconductor device with source trench and termination trench implants, substantially as shown in and/or described in connection with at least one of the figures, and as set forth in the claims.

BRIEF DESCRIPTION OF THE DRAWINGS

FIG. 1 is a flowchart illustrating a method of forming a power semiconductor device according to one implementation of the present application.

FIG. 2C illustrates a cross-sectional view of a portion of a power semiconductor device processed in accordance with an intermediate action in the flowchart of FIG. 1 according to one implementation of the present application.

DETAILED DESCRIPTION

Figure 2A:
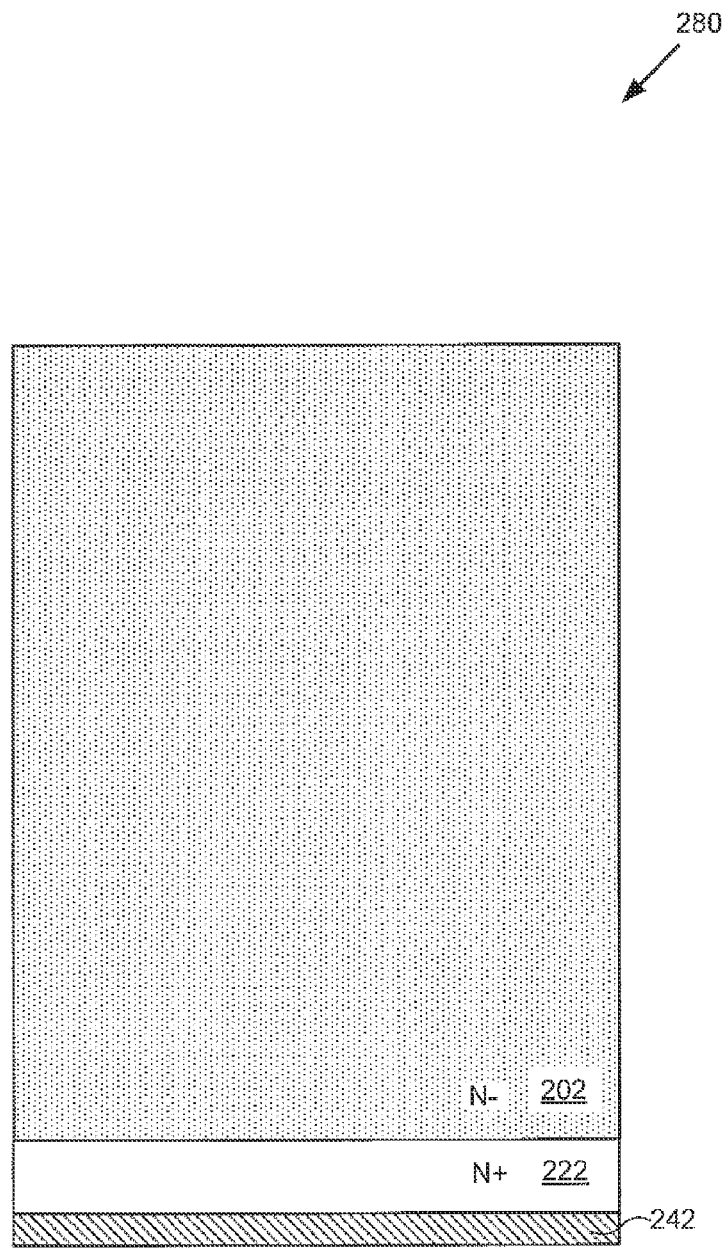
FIG. 2A illustrates a cross-sectional view of a portion of a power semiconductor device processed in accordance with an initial action in the flowchart of FIG. 1 according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a flowchart illustrating an exemplary method of forming an exemplary power semiconductor device according to an implementation of the present application. Certain details and features have been left out of the flowchart that are apparent to a person of ordinary skill in the art. For example, an action may consist of one or more subactions or may involve specialized equipment or materials, as known in the art. Actions 180, 182, 184, 186, 188 and 190 indicated in the flowchart are sufficient to describe one implementation of the present inventive concepts, other implementations of the present inventive concepts may utilize actions different from those shown in the flowchart. Moreover, structures 280, 282, 284, 286, 288 and 290 in FIGS. 2A, 2B, 2C, 2D, 2E and 2F illustrate the results of performing actions 180, 182, 184, 186, 188 and 190 of flowchart 100, respectively. For example, structure 280 is an exemplary structure of a portion of a power semiconductor device after processing action 180, structure 282 is an exemplary structure of a portion of a power semiconductor device after the processing of action 182, structure 284 is an exemplary structure of a portion of a power semiconductor device after the processing of action 184, and so forth.

Referring to action 180 in FIG. 1 and structure 280 in FIG. 2A, action 180 includes forming a drain region and a drift region over the drain region, where the drain region and the drift region are of a first conductivity type. Referring to FIG. 2A, structure 280 illustrates a cross-sectional view of a portion of a power semiconductor device after completion of action 180 in flowchart 100 of FIG. 1, according to one implementation of the present disclosure. As illustrated in FIG. 2A, structure 280 includes drain region 222 and drift region 202 formed over drain region 222. In the present implementation, drain region 222 includes a highly doped semiconductor (e.g., silicon) substrate as a drain of a power semiconductor device, such as a power MOSFET. Drain region 222 is of a first conductivity type and is shown as having N+ conductivity by way of example. In the present implementation, drain region 222 may include an N type dopant, such as Phosphorus or Arsenic. In another implementation, drain region 222 may include a P type dopant, such as Boron. Drain contact 242 is formed at the bottom of drain region 227.

Drift region 202 may include any semiconductor material, such as silicon, that can be epitaxially grown (e.g., epitaxial layer) on drift region 202. For example, drift region 202 may include epitaxial silicon grown on drain region 222. Drift region 202 is of the first conductivity type, and is shown as having N conductivity by way of example. In one implementation, drift region 202 can be intrinsically or pre-doped to be an N type material, or can be subsequently doped to become an N type material, for example. In one implementation, drift region 202 can have a thickness between 5-10 microns (e.g., 8 microns). In another implementation, drift region 202 may have a thickness of less than 5 microns or greater than 10 microns to suit the specific needs of a particular application.

Figure 2B:
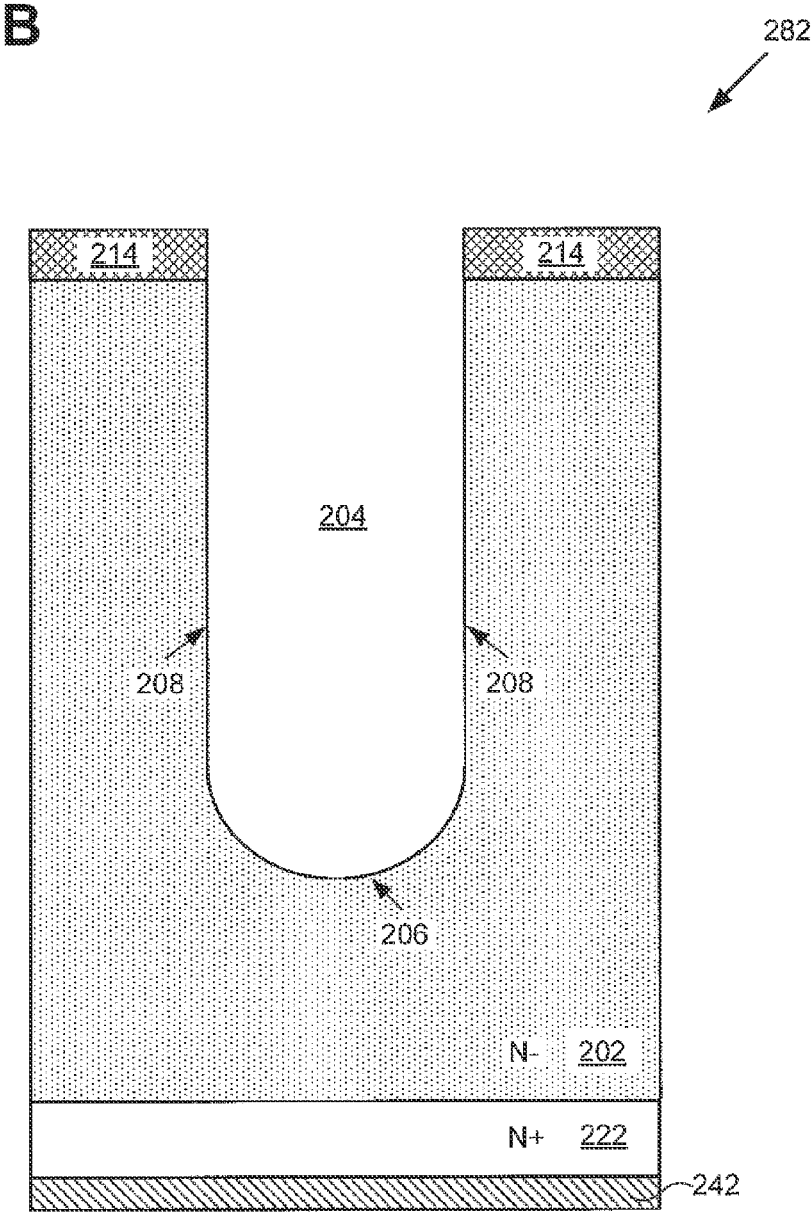
FIG. 2B illustrates a cross-sectional view of a portion of a power semiconductor device processed in accordance with an intermediate action in the flowchart of FIG. 1 according to one implementation of the present application.

Referring to action 182 in FIG. 1 and structure 282 in FIG. 2B, action 182 includes forming a trench (e.g., source and/or termination trench) in the drift region. Referring to FIG. 2B, structure 282 illustrates a cross-sectional view of a portion of a power semiconductor device after completion of action 182 in flowchart 100 of FIG. 1, according to one implementation of the present disclosure. As illustrated in FIG. 2B, structure 282 includes trench 204 formed in drift region 202. In one implementation, trench 204 may be a source trench. In another implementation, trench 204 may be a termination trench. In yet another implementation, multiple trenches 204 (not explicitly shown in FIG. 2B) may be formed in drift region 202, with at least one of trenches 204 being a source trench and at least another one of trenches 204 being a termination trench.

Trench 204 may be formed by etching drift region 202 using patterned photoresist layer 214, for example. Thus, trench 204 extends into drift region 202. In one implementation, trench 204 may have a depth of between 4-7 microns (e.g., 6 microns). In another implementation, trench 204 may have a depth of less than 4 microns or greater than 7 microns to suit the specific needs of a particular application. As illustrated in FIG. 2B, trench 204 includes substantially parallel sidewalls 208 extending into bottom 206. In the present implementation, trench 204 includes a U-shaped bottom. In another implementation, trench 204 may include sloped sidewalls and/or a flat bottom.

Referring to action 184 in FIG. 1 and structure 284 in FIG. 2C, action 184 includes forming a trench implant (e.g., source and/or termination trench implant) of a second conductivity type in the drift region below the trench (e.g., source and/or termination trench). Referring to FIG. 2C, structure 284 illustrates a cross-sectional view of a portion of a power semiconductor device after completion of action 184 in flowchart 100 of FIG. 1, according to one implementation of the present disclosure. As illustrated in FIG. 2C, structure 284 includes trench implant 212 formed in drift region 202 below trench 204. Trench implant 212 is of a second conductivity type opposite of the first conductivity type. In the present implementation, as drift region 202 is of N conductivity type, implant 210 includes a P type implant, such as boron (B), boron fluoride ($BF_2$) or the like, to form trench implant 212. In another implementation, as drift region 202 may be of P conductivity type, implant 210 may include an N type implant, such as phosphorus or the like, to form trench implant 212. It is noted that patterned photoresist layer 214, which is used during the formation of trench 204, may be used again during the formation of trench implant 212.

As illustrated in FIG. 2C, implant 210 is substantially uniformly implanted across trench implant 212. In the present implementation, trench implant 212 may have a doping concentration of between $1*e^{12}$ atoms/cm$^3$ to $1*e^{13}$ atoms/cm$^3$. In another implementation, trench implant 212 may have a doping concentration of between $1*e^{11}$ atoms/cm$^3$ to $1*e^{16}$ atoms/cm$^3$. In other implementations, trench implant 212 may have a doping concentration of smaller than $1*e^{11}$ atoms/cm$^3$ or greater than $1*e^{16}$ atoms/cm$^3$ to suit the specific needs of a particular application. In the present implementation, implant 210 may be applied at an implant energy of 20-80 KeV to form trench implant 212 in drift region 202 below trench 204. In other implementations, implant 210 may be applied at an implant energy less than 20 KeV or greater than 80 KeV (e.g., aver 1 MeV) to suit the specific needs of a particular application. In one implementation, trench 204 is a source trench, and trench implant 212 is a source trench implant. In another implementation, trench 204 is a termination trench, and trench implant 212 is a termination trench implant.

Figure 2D:
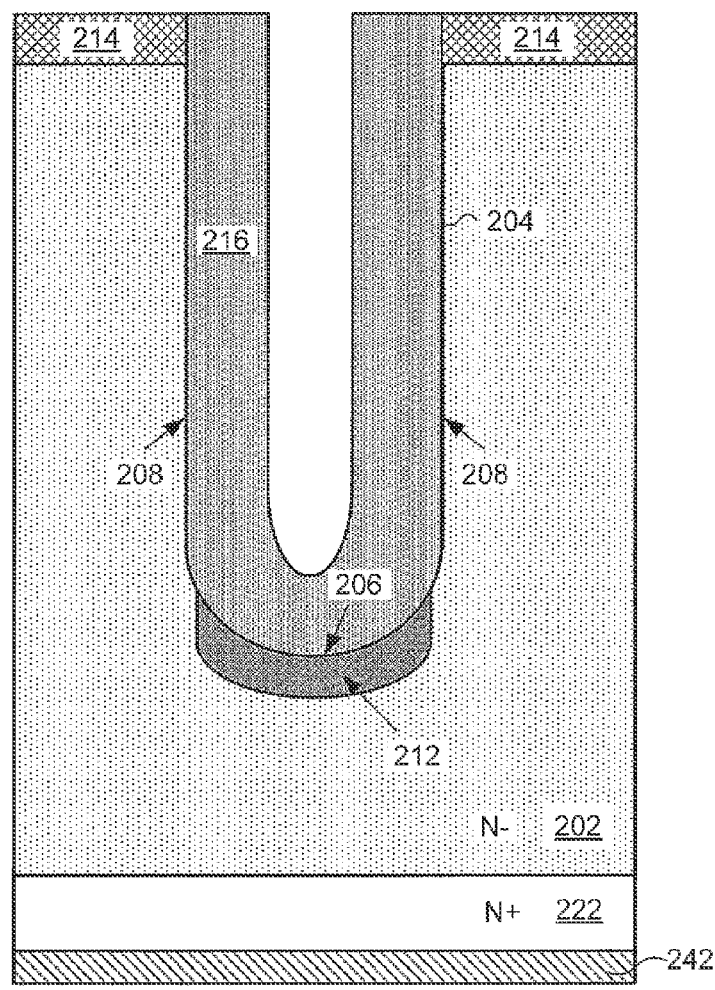
FIG. 2D illustrates a cross-sectional view of a portion of a power semiconductor device processed in accordance with an intermediate action in the flowchart of FIG. 1 according to one implementation of the present application.

Referring to action 186 in FIG. 1 and structure 286 in FIG. 2D, action 186 includes forming a dielectric liner on a bottom and sidewalls of the trench (e.g., source and/or termination trench). Referring to FIG. 2D, structure 286 illustrates a cross-sectional view of a portion of a power semiconductor device after completion of action 186 in flowchart 100 of FIG. 1, according to one implementation of the present disclosure. As illustrated in FIG. 2II), structure 286 includes dielectric liner 216 lining sidewalls 208 and bottom 206 of trench 204. For example, dielectric liner 216 may be formed by depositing and/or thermally growing a dielectric material in trench 204. In the present implementation, dielectric liner 216 includes silicon oxide. In another implementation, dielectric liner 216 may include other suitable dielectric material, such as silicon nitride or tetraethylorthosilicate ("TEOS") oxide. In one implementation, trench 204 is a source trench, and dielectric liner 216 is a source trench dielectric liner. In another implementation, trench 204 is a termination trench, and dielectric liner 216 is a termination trench dielectric liner.

It is noted that, in an alternative implementation, trench implant 212 may be formed after the formation of dielectric liner 216, in which case a high energy implant may be required to penetrate through dielectric liner 216 to form trench implant 212 in drift region 202 below trench 204. In yet another alternative implementation, trench implant 212 may be formed at the beginning or middle of the epitaxial growth of drift region 202.

Figure 2E:
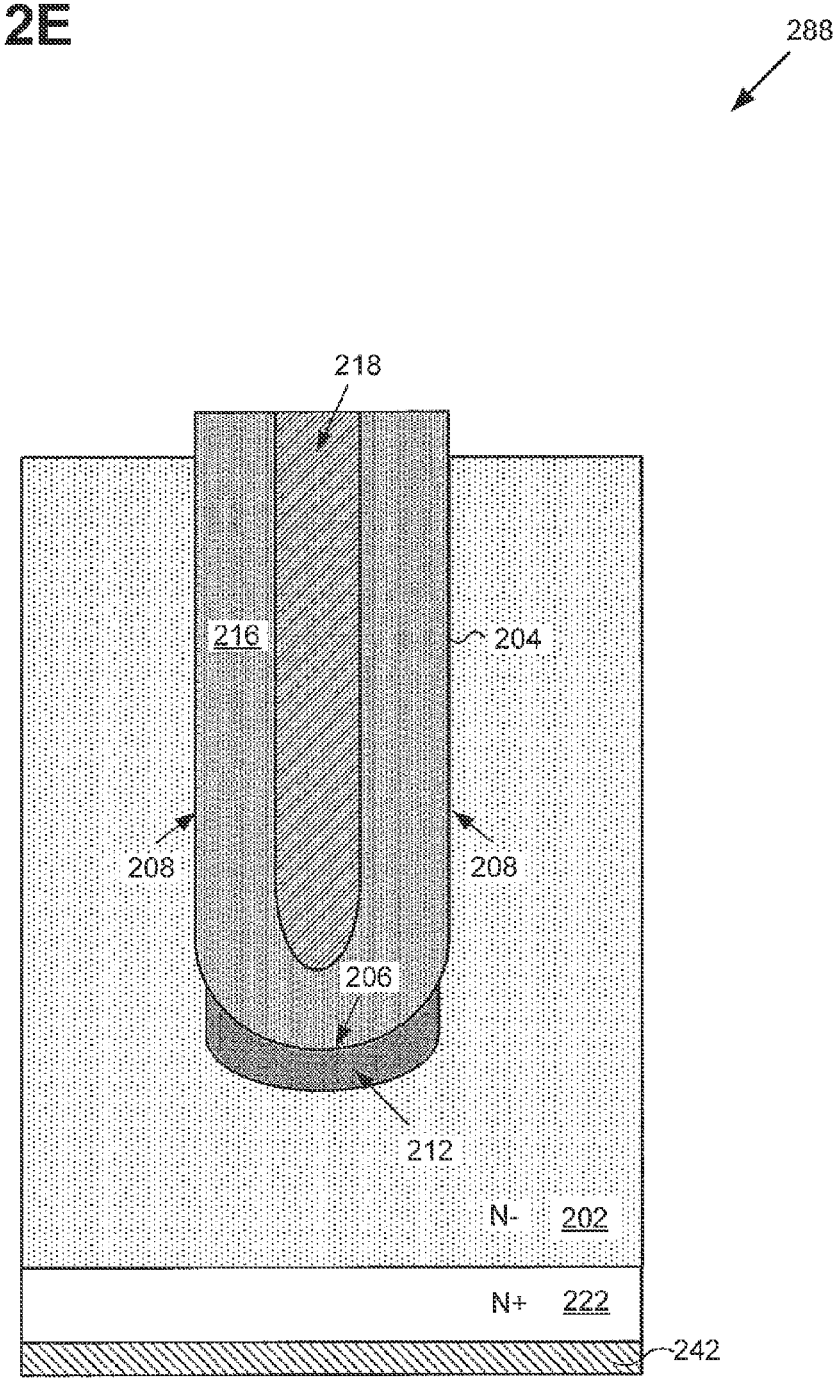
FIG. 2E illustrates a cross-sectional view of a portion of a power semiconductor device processed in accordance with an intermediate action in the flowchart of FIG. 1 according to one implementation of the present application.

Referring to action 188 in FIG. 1 and structure 288 in FIG. 2E, action 188 includes depositing a conductive filler in the trench (e.g., source and/or termination trench). Referring to FIG. 2E, structure 288 illustrates a cross-sectional view of a portion of a power semiconductor device after completion of action 188 in flowchart 100 of FIG. 1, according to one implementation of the present disclosure. As shown in FIG. 2E, structure 288 includes conductive filler 218 deposited in trench 204, where dielectric liner 216 is disposed between conductive filler 218 and drift region 202. In the present implementation, conductive filler 218 may include polysilicon or amorphous silicon. For example, N type doped polysilicon or N type doped amorphous silicon may be used as conductive filler 218 to fill in trench 204. In some implementations, it may be preferred to use polysilicon or amorphous silicon as conductive filler 218, because the doping concentration can be well controlled such that conductive filler 218 can have a substantially uniform doping concentration in trench 204. In other implementations, metallic material, such as tungsten and tungsten silicide, can be used as conductive filler 218. In one implementation, trench 204 is a source trench, and conductive filler 218 is a source trench conductive filler. In another implementation, trench 204 is a termination trench, and conductive filler 218 is a termination trench conductive filler.

Figure 2F:
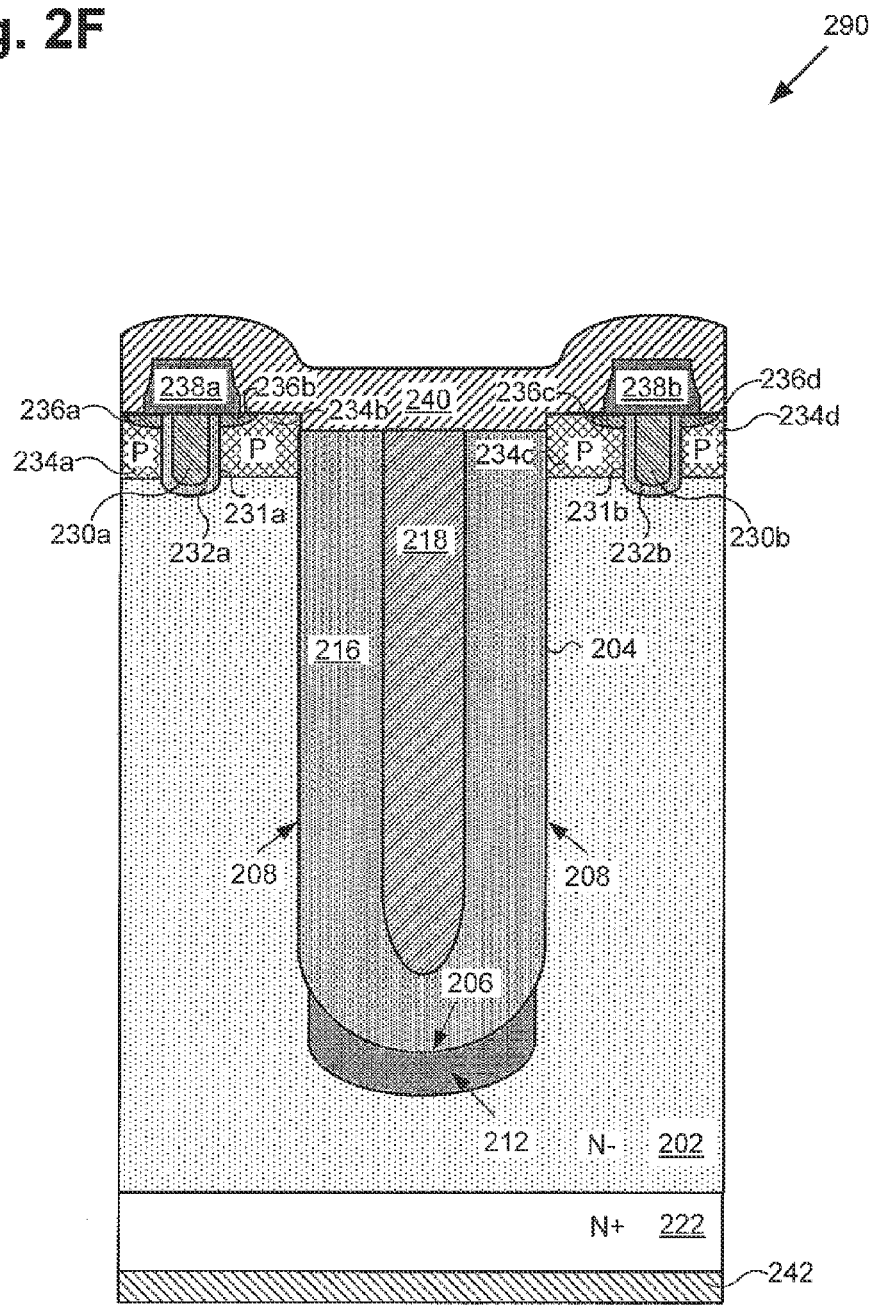
FIG. 2F illustrates a cross-sectional view of a portion of a power semiconductor device processed in accordance with a final action in the flowchart of FIG. 1 according to one implementation of the present application.

Referring to action 190 in FIG. 1 and structure 290 in FIG. 2F, action 190 includes forming a source region in a body region over the drift region, and a gate trench adjacent to the source region and extending through the body region into the drift region. Referring to FIG. 2F, structure 290 illustrates a cross-sectional view of a portion of a power semiconductor device after completion of action 190 in flowchart 100 of FIG. 1, according to one implementation of the present disclosure. As shown in FIG. 2F, structure 290 includes body regions 234a, 234b, 234c and 234d (collectively referred to as body region 234) of the second conductivity type (e.g., P type) over drift region 202, gate trenches 231a and 231b having gate electrodes 230a and 230b respectively surrounded by gate dielectric liners 232a and 232b and extending through body region 234 into drift region 202, source regions 236a, 236b, 236c and 236d of the first conductivity type (e.g., N+ type), and drain region 222 of the first conductivity type (e.g., N+ type). In other implementations, drift region 202, drain region 222 and source regions 236a, 236b, 236c and 236d can be of P conductivity type, and body regions 234a, 234b, 234c and 234d and trench implant 212 can be of N conductivity type. In the present implementation, the gate trench is formed after the formation of trench 204. In another implementation, the gate trench may be formed before the formation of trench 204.

As illustrated in FIG. 2F, trench 204 (e.g., source trench) extends through body region 234 into drift region 202, where dielectric liner 216 is formed in trench 204 and conductive filler 218 is surrounded by dielectric liner 216. Trench 204 includes substantially parallel trench sidewalls 208 and bottom 206. Trench implant 212 is below trench 204 in drift region 202. As illustrated in FIG. 2F, in the present implementation, trench implant 212 has a width smaller than a width of trench 204. In another implementation, trench implant 212 may have a width greater than or equal to a width of trench 204. As illustrated in FIG. 2F, structure 290 also includes dielectric caps 238a and 238b, source contact 240, and drain contact 242. Dielectric caps 238a and 238b electrically insulate gate electrodes 230a and 230b, respectively, from source regions 236a, 236b, 236c and 236d and source contact 240. Conductive filler 218 of trench 204 is electrically coupled to source regions 236a, 236b, 236c and 236d through source contact 240. Drain contact 242 is formed below drain region 222.

As discussed above, it is desirable for a trench type power semiconductor device to have a reduced on-state resistance (R×A) factor and still be able to withstand a high drain-to-source voltage during its off-state (i.e., a high reverse voltage blocking capability). However, while increasing the depth of the source trench may improve the breakdown voltage, it may also increase the on-state resistance R×A factor. Thus, a reduction in the breakdown voltage to source trench depth sensitivity may improve the on-state resistance (R×A) factor without compromising the breakdown voltage. For example, in a power semiconductor device having multiple source trenches in an active region, there may be a variation in trench depth (e.g., ±1 m) among the source trenches, which may in turn lead to a variation in breakdown voltage among the source trenches, reducing the overall breakdown voltage of the power semiconductor device. The presence of trench implant 212 may increase the breakdown voltage of the power semiconductor device by reducing the high electric field points at the bottom corners of trench 204. Since the presence of trench implant 212 may increase the breakdown voltage of the power semiconductor device without increasing the trench depth, trench implant 212 can advantageously make the power semiconductor device less sensitive to the variation in trench depth among the source trenches, thereby improving operation stability of the power semiconductor device. In the present implementation, the presence of trench implant 212 can increase the breakdown voltage by 5% (e.g., 5 volts in a 100-volt device). In other implementations, trench implant 212 can increase the breakdown, voltage by less than or greater than 5% depending on the specific doping concentration of trench implant 212.

The output capacitance (Coss) is another important parameter in a power semiconductor device. The output capacitance may be dominated by a drain-to-source capacitance ($C_{DS}$) and a gate-to-drain capacitance ($C_{GD}$). The drain-to-source capacitance includes a capacitance associated with a source-to-drain overlap, which is an overlap of the conductive filler (e.g., polysilicon) in the source trench and the semiconductor material (e.g., silicon) between the source trench and the drain region. Since trench implant 212 and drift region 202 are of different conductivity, a p-n junction is created below trench 204, where the p-n junction can effectively shield a source-to-drain overlap, thereby reducing the drain-to-source capacitance. In the present implementation, trench implant 212 can reduce the drain-to-source capacitance by, for example, 10-25%. In other implementations, trench implant 212 can reduce the drain-to-source capacitance by less than 10% or greater than 25% (e.g., 30%) depending on the specific doping concentration of trench implant 212. As discussed above, the presence of trench implant 212 may increase the breakdown voltage of the power semiconductor device without increasing the trench depth. Since increasing the trench depth also increases the drain-to-source capacitance, trench implant 212 can provide the flexibility of reducing the trench depth without comprising the breakdown voltage, thereby further improving the output capacitance.

In a conventional trench type semiconductor device, impact ionization occurs at an interface between the trench dielectric and the drift region, which can cause damage to the interface and lead to an increase in drain-to-source leakage and/or breakdown voltage degradation. By contrast, due to the presence of trench implant 212 at the bottom of trench 204, impact ionization is substantially reduced and moved away from the interface between dielectric liner 216 and drift region 202 (e.g., sidewalls 208 and bottom 206 of trench 204), thereby increasing the reliability and longevity of the power semiconductor device. In the present implementation, the impact ionization location is moved partially or completely away from sidewalls 208 of trench 204. In the present implementation, the impact ionization location is near the interface between trench implant 212 and drift region 202 under trench 204. It is noted that although trench implant 212 may have an effect on the on-state resistance R×A factor, the increase in the R×A factor is relative small (e.g., 1%) as compared to the improvements it makes on the breakdown voltage (e.g., 5%) and the output capacitance (e.g., 10-25%).

Figure 3:
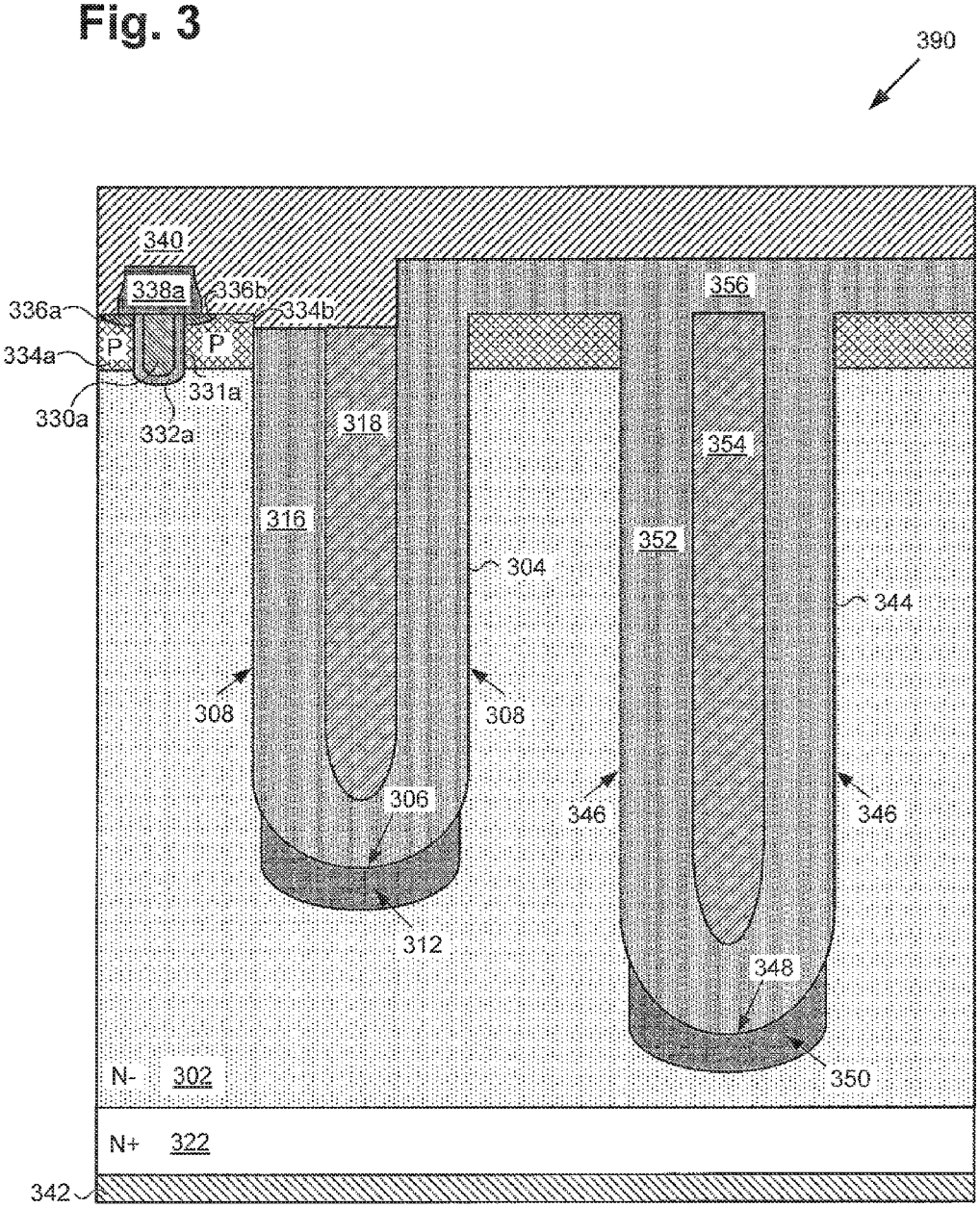
FIG. 3 illustrates a cross-sectional view of a portion of a power semiconductor device according to one implementation of the present application.

Turning to FIG. 3, FIG. 3 illustrates a cross-sectional view of a portion of a power semiconductor device according to one implementation of the present application. As illustrated in FIG. 3, structure 390 may include one or more trench type power MOSFETs or IGBTs. Structure 390 includes drain region 322 of a first conductivity type (e.g., N+ type), drift region 302 of the first conductivity type (e.g., N– type) formed over drain region 322, source trench 304, source plant 312 in drift region 302 below source trench 304, and termination trench 344, termination trench, implant 350 in drift region 302 below termination trench 344. Structure 390 also includes body regions 334a and 334b (collectively referred to as body region 334) of a second conductivity type (e.g., P type) over drift region 302, gate trench 331a having gate electrode 330a surrounded by gate dielectric liner 332a and extending through body region 334 into drift region 302, source regions 336a and 336b of the first conductivity type (e.g., N+ type), dielectric cap 338a, source contact 340 and drain contact 342. As illustrated in FIG. 3, source trench conductive filler 318 of source trench 304 is electrically coupled to so, rce regions 336a and 336b through source contact 340. Dielectric layer 356 is formed partially over source trench 304, and extends over termination trench 344, where dielectric layer 356 and termination trench dielectric liner 352 electrically insulate termination trench conductive filler 354 from source contact 340. In an alternative implementation drift region 302, drain region 322 and source regions 336a and 336b can be of P conductivity type, and body regions 334a and 334b and source trench implant 312 and termination trench implant 350 can be of N conductivity type. It is noted that, in ore implementation, termination trench conductive filler 354 in termination trench 344 may be electrically connected to the source potential in a third dimension not explicitly shown in FIG. 3. In the present implementation, source trench 304, source trench implant 312, termination trench 344 and termination trench implant 350 may be formed, for example, by actions 180 through 188 of flowchart 100 in FIG. 1. In one implementation, source trench 304 and termination trench 344 may be formed simultaneously in a single processing action. In another implementation, source trench 304 and termination trench 344 may be formed in difference processing actions. It should be noted that, source trench 304 may have a strip layout along a third dimension not explicitly shown in FIG. 3, a cellular layout or other suitable layout schemes, where source trench implant 312 may be formed in drift region 302 below source trench 304 in any of such source trench layout schemes. In one implementation, source trench implant 312 and termination trench implant 350 may be formed simultaneously in a single processing action. In another implementation, source trench implant 312 and termination trench implant 350 may be formed in difference processing actions.

As illustrated in FIG. 3, source trench implant 312 is formed in drift region 302 below source trench 304. Similar to trench 204 in FIG. 2F, source trench 304 includes source trench dielectric liner 316 disposed on sidewalls 308 and bottom 306 thereof. Source trench conductive filler 318 is formed in source trench 304 and surrounded by source trench dielectric liner 316. In the present implementation, source trench dielectric liner 316 includes silicon oxide. In other implementations, source trench dielectric liner 316 may include other suitable dielectric material, such as silicon nitride or tetraethylorthosilicate ("TEOS") oxide. Source trench conductive filler 318 may include polysilicon or amorphous silicon. In other implementations, metallic material, such as tungsten and tungsten amide, can be used as source trench conductive filler 318. In the present implementation, as drift region 302 is of N conductivity type, source trench implant 312 includes a P type implant, such as boron (B), boron fluoride ($BF_2$) or the like. Source trench implant 312 may have a substantially uniformly dopant concentration. In another implementation, as drift region 302 may be of P conductivity type, source trench implant 312 may include an N type implant, such as phosphorus or the like.

Similar to trench implant 212 in FIG. 2F, the presence of source trench implant 312 may increase the breakdown voltage of the power semiconductor device due to the depletion at the bottom of source trench 304. Since the presence of source trench implant 312 can increase the breakdown voltage of the power semiconductor device without increasing the trench depth, source trench implant 312 can advantageously make the power semiconductor device less sensitive to the variation in trench depth among the source trenches, thereby improving operation stability of the power semiconductor device. Since source trench implant 312 and drift region 302 are of different conductivity, a p-n junction is created below source trench 304, where the p-n junction can effectively shield a source-to-drain overlap, thereby reducing the Coss. Also, source trench implant 312 may also increase the breakdown voltage of the power semiconductor device without increasing the trench depth. Since increasing the trench depth increases the output capacitance, source trench implant 312 can provide the flexibility of reducing the trench depth without comprising the breakdown voltage, thereby further improving the output capacitance. Moreover, due to the presence of source trench implant 312 at the bottom of source trench 304, impact ionization is substantially reduced and moved away from the interface between source trench dielectric liner 316 and drift region 302, thereby increasing the reliability and longevity of power semiconductor device. In the present implementation, the impact ionization location is moved partially or completely away from sidewalls 308 of source trench 304. The impact ionization location is near the interface between source trench implant 312 and drift region 302 under source trench 304.

As illustrated in FIG. 3, termination trench 344 is adjacent to source trench 304, and disposed in a termination area which surrounds an active area having one or more active cells. For example, one of the active cells includes at least one source region (e.g., source regions 336a and 336b), a source contact (e.g., source contact 340) electrically connected to the source region, a source trench (e.g., source trench 304) electrically connected to the source contact, and a gate trench (e.g., gate trench 331a) adjacent to the source trench, and a drain region (e.g., drain region 322).

As illustrated in FIG. 3, termination trench implant 350 is formed in drift region 302 below termination trench 344. Termination trench 344 includes termination trench dielectric liner 352 disposed on sidewalls 346 and bottom 348 thereof. Termination trench conductive filler 354 is formed in termination trench 344 and surrounded by termination trench dielectric liner 352. In the present implementation, termination trench dielectric liner 352 includes silicon oxide. In other implementations, termination trench dielectric liner 352 may include other suitable dielectric material, such as silicon nitride or tetraethylorthosilicate ("TEOS") oxide. Termination trench conductive filler 354 may include polysilicon or amorphous silicon. In other implementations, metallic material, such as tungsten and tungsten silicide, can be used as termination trench conductive filler 354.

As illustrated in FIG. 3, termination trench 344 extends deeper into drill region 302 than source trench 304 does, which allows termination trench 344 to support additional voltage, thereby increasing the breakdown voltage. In one implementation, termination trench 344 may have a greater width than that of source trench 304. In implementation, termination trench dielectric liner 352 in termination trench 344 may be thicker than source trench dielectric liner 6. As such, termination trench 344 can advantageously sustain a high electric field and maintain a high breakdown voltage. In the present implementation, as drift region 302 is of N conductivity type, termination trench implant 350 includes a P type implant, such as boron (B), boron fluoride ($BF_2$) or the like. Termination trench implant. 350 may have a substantially uniformly dopant concentration. In another implementation, drift region 302 may be of P conductivity type, termination trench implant 350 may include an N type implant, such as phosphorus or the like.

Similar to source trench implant 312, the presence of termination trench implant 350 may also increase the breakdown voltage of the power semiconductor device due to the depletion at the bottom of termination trench 344, thereby further improving operation stability of the power semiconductor device. Moreover, due to the presence of termination trench implant 350 at the bottom of termination trench 344, impact ionization is substantially reduced and moved away from the interface between termination trench dielectric liner 352 and drift region 302, thereby increasing the reliability and longevity of the power semiconductor device. In the present implementation, the impact ionization location is moved partially or completely away from sidewalls 346 of termination trench 344. The impact ionization location is near the interface between termination trench implant 350 and drift region 302 under termination trench 344.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in for and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A power semiconductor device comprising:
a source region in a body region;
a gate trench adjacent to said source region;
a source trench electrically coupled to said source region, said source trench having a source trench conductive filler surrounded by a source trench dielectric liner, said source trench extending into a drift region;
a source trench implant below said source trench, said source trench implant having a conductivity type opposite that of said drift region;
said source trench being electrically insulated from said source trench implant by said source trench dielectric liner;
a drain region below said drift region.

2. The power semiconductor device of claim 1 wherein said source trench implant is configured to substantially reduce an impact ionization at an interface between said source trench dielectric liner and said drift region of said source trench.

3. The power semiconductor device of claim 1 wherein said source trench implant and said drift region form a p-n junction below said source trench.

4. The power semiconductor device of claim 1 wherein said gate trench extends through said body region into said drift region.

5. The power semiconductor device of claim 1 further comprising a termination trench adjacent to said source trench.

6. The power semiconductor device of claim 5 wherein said termination trench includes a termination trench conductive filler surrounded by a termination trench dielectric liner.

7. The power semiconductor device of claim 5 further comprising a termination trench implant below said termination trench.

8. A power semiconductor device comprising:
a source region in a body region;
a gate trench adjacent to said source region;
a source trench electrically coupled to said source region;
a termination trench in said drift region adjacent to said source trench, said termination trench having a termination trench conductive filler surrounded by a termination trench dielectric liner;
a termination trench implant below said termination trench, said termination trench implant having a conductivity type opposite that of said drift region;
said termination trench being electrically insulated from said termination trench implant by said termination trench dielectric liner;
a drain region below said drift region.

9. The power semiconductor device of claim 8 wherein said termination trench implant substantially increases a breakdown voltage of said power semiconductor device.

10. The power semiconductor device of claim 8 further comprising a source trench implant under said source trench.

11. The power semiconductor device of claim 8 wherein said termination trench dielectric liner comprises silicon oxide.

12. The power semiconductor device of claim 8 wherein said drift region comprises silicon.

13. A method of forming a power semiconductor device, said method comprising:
forming a drift region of a first conductivity type;
forming a trench in said drift region;
forming a trench implant of a second conductivity type below said trench;
forming a dielectric liner on a bottom and sidewalls of the trench;
depositing, after forming said trench implant of said second conductivity type below said trench, a conductive filler surrounded by said dielectric liner.

14. The method of claim 13 further comprising forming a source region in a body region over said drift region, said source region electrically coupled to said conductive filler in said trench.

15. The method of claim 14 further comprising forming a gate trench adjacent to said source region and extending through said body region into said drift region.

16. The method of claim 14 further comprising forming a drain region below said drift region.

17. The method of claim 13 wherein said trench is a source trench.

18. The method of claim 17 wherein said trench implant is a source trench implant configured to substantially reduce at an interface between said dielectric liner and said drift region.

19. The method of claim 13 wherein said trench is a termination trench.

20. The method of claim 19 wherein said trench implant is a termination trench implant configured to substantially increase a breakdown voltage of said power semiconductor device.

* * * * *